(12) United States Patent
Lee et al.

(10) Patent No.: US 10,930,875 B2
(45) Date of Patent: Feb. 23, 2021

(54) ORGANIC LIGHT-EMITTING DISPLAY APPARATUS AND METHOD OF MANUFACTURING THE SAME

(71) Applicant: Samsung Display Co., Ltd., Yongin-si (KR)

(72) Inventors: Duckjung Lee, Yongin-si (KR); Arong Kim, Yongin-si (KR); Jungsun Park, Yongin-si (KR); Hyunsung Bang, Yongin-si (KR); Jiyoung Choung, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/693,382

(22) Filed: Nov. 25, 2019

(65) Prior Publication Data

US 2020/0099006 A1 Mar. 26, 2020

Related U.S. Application Data

(62) Division of application No. 15/659,569, filed on Jul. 25, 2017, now Pat. No. 10,522,779.

(30) Foreign Application Priority Data

Aug. 12, 2016 (KR) .................. 10-2016-0103196

(51) Int. Cl.
*H01L 51/56* (2006.01)
*G03F 7/40* (2006.01)
(Continued)

(52) U.S. Cl.
CPC ............ *H01L 51/5092* (2013.01); *G03F 7/20* (2013.01); *G03F 7/40* (2013.01); *H01L 51/0018* (2013.01);
(Continued)

(58) Field of Classification Search
CPC ............ H01L 51/0018; H01L 51/5064; H01L 51/5092; H01L 51/56; H01L 51/50;
(Continued)

(56) References Cited

U.S. PATENT DOCUMENTS 6,215,250 B1 ‡ 4/2001 Hirano ................ H01L 27/3281
315/169.1
7,492,337 B2 ‡ 2/2009 Fukase .................. H01L 27/326
345/76
(Continued)

FOREIGN PATENT DOCUMENTS

JP 2002-170669 ‡ 6/2002
JP 2007-273826 ‡ 10/2007
(Continued)

OTHER PUBLICATIONS

Non-Final Office Action dated Jun. 10, 2019, issued in U.S. Appl. No. 15/659,569.
(Continued)

*Primary Examiner* — John A McPherson
(74) *Attorney, Agent, or Firm* — H.C. Park & Associates, PLC

(57) ABSTRACT

An organic light-emitting display apparatus including: a first electrode of a first group; a first organic functional layer covering the first electrode of the first group and including a first emission layer; a second electrode of the first group covering the first organic functional layer; a first electrode of a second group separate from the first electrode of the first group; a second organic functional layer separate from the first organic functional layer, covering the first electrode of the second group, having a larger area than the first organic functional layer, and including a second emission layer; a second electrode of the second group covering the second organic functional layer; and a common electrode integrally
(Continued)

and commonly disposed on the second electrode of the first group and the second electrode of the second group.

10 Claims, 20 Drawing Sheets

(51) Int. Cl.
  *H01L 51/50*    (2006.01)
  *H01L 51/00*    (2006.01)
  *G03F 7/20*     (2006.01)
  *H01L 27/32*    (2006.01)
  *H01L 51/52*    (2006.01)

(52) U.S. Cl.
  CPC .......... *H01L 51/5064* (2013.01); *H01L 51/56* (2013.01); *H01L 27/3211* (2013.01); *H01L 27/3218* (2013.01); *H01L 51/0096* (2013.01); *H01L 51/5209* (2013.01); *H01L 51/5231* (2013.01)

(58) Field of Classification Search
  CPC . H01L 51/00; H01L 51/0096; H01L 51/5209; H01L 51/5231; H01L 27/3211; G03F 7/20; G03F 7/2002; G03F 7/40
  USPC .................................. 430/319, 321; 313/504
  See application file for complete search history.

(56) References Cited

U.S. PATENT DOCUMENTS

| | | | | |
|---|---|---|---|---|
| 10,263,210 B2 ‡ | 4/2019 | Kwon | ................. | H01L 51/0016 |
| 2004/0075385 A1 * | 4/2004 | Tao | ....................... | H05B 33/20 |
| | | | | 313/506 |
| 2004/0096771 A1 * | 5/2004 | Kashiwagi | ............ | H01L 21/312 |
| | | | | 430/192 |
| 2007/0029929 A1 ‡ | 2/2007 | Nakamura | .......... | H01L 27/3276 |
| | | | | 313/506 |
| 2007/0231975 A1 ‡ | 10/2007 | Asou | ................. | H01L 29/66765 |
| | | | | 438/15 |
| 2010/0253222 A1 ‡ | 10/2010 | Koshihara | ........... | H01L 51/5265 |
| | | | | 315/32 |
| 2013/0146859 A1 * | 6/2013 | Hartmann | ........... | H01L 51/5212 |
| | | | | 257/40 |
| 2014/0306198 A1 ‡ | 10/2014 | Im | ....................... | H01L 51/0013 |
| | | | | 257/40 |
| 2015/0044801 A1 ‡ | 2/2015 | Lee | ........................ | G03F 7/0046 |
| | | | | 438/35 |
| 2016/0248039 A1 ‡ | 8/2016 | Choung | ........... | H01L 51/5228 |
| 2016/0276615 A1 ‡ | 9/2016 | Kitabayashi | ........ | H01L 51/5036 |
| 2017/0222148 A1 * | 8/2017 | Defranco | ............ | H01L 21/0274 |
| 2018/0033967 A1 * | 2/2018 | Bang | .................. | H01L 51/0016 |

FOREIGN PATENT DOCUMENTS

| | | | |
|---|---|---|---|
| JP | 2008-085200 | ‡ | 4/2008 |
| JP | 2008-177443 | ‡ | 7/2008 |
| KR | 10-2002-0029533 | ‡ | 4/2002 |
| KR | 10-2002-0029553 | | 4/2002 |
| WO | 2008/038588 | | 4/2008 |
| WO | WO-2008/038588 | ‡ | 4/2008 |

OTHER PUBLICATIONS

Notice of Allowance dated Sep. 9, 2019, issued in U.S. Appl. No. 15/659,569.

\* cited by examiner
‡ imported from a related application

ORGANIC LIGHT-EMITTING DISPLAY APPARATUS AND METHOD OF MANUFACTURING THE SAME

CROSS-REFERENCE TO RELATED APPLICATION

This application is a Division of U.S. patent application Ser. No. 15/659,569, filed on Jul. 25, 2017, which claims priority from and the benefit of Korean Patent Application No. 10-2016-0103196, filed on Aug. 12, 2016, each of which is hereby incorporated by reference for all purposes as if fully set forth herein.

BACKGROUND

Field

Exemplary embodiments relate to an organic light-emitting display apparatus and a method of manufacturing the same.

Discussion of the Background

An organic light-emitting display apparatus includes a hole injection electrode, an electron injection electrode, and an organic emission layer between the hole injection electrode and the electron injection electrode, and is a self-emissive display apparatus, in which holes injected from the hole injection electrode and electrons injected from the electron injection electrode recombine in the organic emission layer and distinguish to emit light. The organic light-emitting display apparatus is regarded as a next generation display apparatus as a result of several desirable inherent characteristics, such as low power consumption, high brightness, and fast response speeds.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide an organic light-emitting display apparatus and a method of manufacturing the organic light-emitting display apparatus, capable of decreasing defects, simplifying manufacturing processes, and reducing cost.

Additional aspects will be set forth in the detailed description which follows, and, in part, will be apparent from the disclosure, or may be learned by practice of the inventive concept.

An exemplary embodiment discloses an organic light-emitting display apparatus including: a first electrode of a first group; a first organic functional layer covering the first electrode of the first group and including a first emission layer; a second electrode of the first group covering the first organic functional layer; a first electrode of a second group separate from the first electrode of the first group; a second organic functional layer separate from the first organic functional layer, covering the first electrode of the second group, having a larger area than the first organic functional layer, and including a second emission layer; a second electrode of the second group covering the second organic functional layer; and a common electrode integrally and commonly disposed on the second electrode of the first group and the second electrode of the second group.

An exemplary embodiment also discloses a method of manufacturing an organic light-emitting display apparatus including: forming a first electrode of a first group and a first electrode of a second group on a substrate so as to be separate from each other; sequentially forming a lift-off layer and first photoresist on the first electrode of the first group and the first electrode of the second group; forming a first portion where the lift-off layer is removed, in a region corresponding to the first electrode of the first group, and a second portion where the lift-off layer remains; sequentially forming, in the first portion, a first organic functional layer including a first emission layer and a second electrode of the first group; heat-treating the lift-off layer so that the lift-off layer fills the first portion; removing the first photoresist, the first organic functional layer, and the second electrode of the first group that remain on the lift-off layer of the second portion; forming second photoresist on the lift-off layer; forming a third portion where the lift-off layer is removed, in a region corresponding to the first electrode of the second group, and a fourth portion where the lift-off layer remains; sequentially forming, in the third portion, a second organic functional layer comprising a second emission layer and a second electrode of the second group; heat-treating the lift-off layer so that the lift-off layer fills the third portion; and removing the second photoresist, the second organic functional layer, and the second electrode of the second group that remain on the lift-off layer of the fourth portion.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EXEMPLARY EMBODIMENTS

Figure 1:
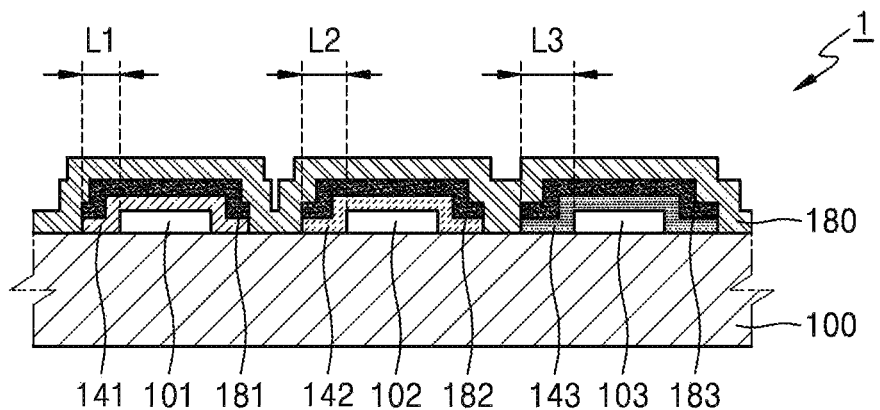
FIG. 1 is a schematic cross-sectional view of an organic light-emitting display apparatus according to an exemplary embodiment.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid io unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or is "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, s layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or is features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular exemplary embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. The regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to is which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

FIG. 1 is a schematic cross-sectional view of an organic light-emitting display apparatus 1 according to an exemplary embodiment.

Referring to FIG. 1, in the organic light-emitting display apparatus 1 according to the present exemplary embodiment, a plurality of anodes including a first anode 101, a second anode 102, and a third anode 103 are arranged to be separate from one another on a substrate 100. First to third organic functional layers 141, 142, and 143 including first to third emission layers are respectively arranged on the first to third anodes 101, 102, and 103, first to third auxiliary cathodes 181, 182, and 183 are respectively arranged on the first to third organic functional layers 141, 142, and 143, and an integral cathode 180 is disposed on the first to third auxiliary cathodes 181, 182, and 183 as a common electrode.

The first organic functional layer 141 covers an entire width of the first anode 101 and a region corresponding to a first distance L1, the second organic functional layer 142 covers an entire width of the second anode 102 and a region corresponding to a second distance L2, and the third organic functional layer 143 covers an entire width of the third anode 103 and a region corresponding to a third distance L3. The second distance L2 is greater than the first distance L1, and the third distance L3 is greater than the second distance L2.

A method of manufacturing the organic light-emitting display apparatus 1 according to the present exemplary embodiment and the organic light-emitting display apparatus 1 manufactured by the manufacturing method will be described in detail with reference to FIGS. 2 to 5E.

Figure 2:
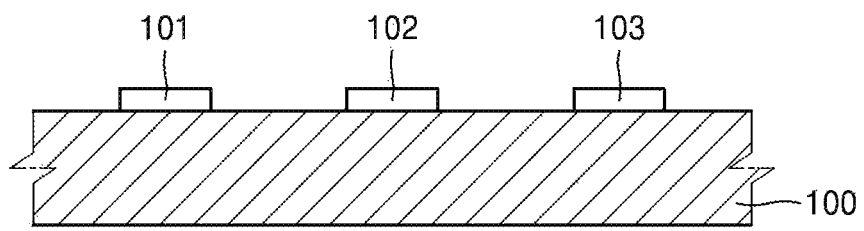
FIG. 2 is a schematic cross-sectional view of a plurality of anodes formed on a substrate of the organic light-emitting display apparatus according to an exemplary embodiment.

FIG. 2 is a schematic cross-sectional view of the plurality of anodes, namely, first, second, and third anodes 101, 102, and 103, formed on the substrate 100 of the organic light-emitting display apparatus 1 according to an exemplary embodiment. FIGS. 3A to 3F are schematic cross-sectional views of a first unit process of the organic light-emitting display apparatus 1 according to an exemplary embodiment. FIGS. 4A to 4E are schematic cross-sectional views of a second unit process of the organic light-emitting display apparatus 1 according to an exemplary embodiment. FIGS. 5A to 5E are schematic cross-sectional views of a third unit process of the organic light-emitting display apparatus 1 according to an exemplary embodiment.

Referring to FIG. 2, a plurality of anodes, including the first anode 101, the second anode 102, and the third anode 103, are formed on the substrate 100.

The substrate 100 may include various materials. For example, the substrate 100 may include glass or plastic. The plastic may include a material having excellent heat-resistance and durability, such as polyimide, polyethylene naphthalate, polyethylene terephthalate, polyarylate, polycarbonate, polyetherimide, or polyethersulfone.

Although not illustrated in FIG. 2, a buffer layer (not shown) for forming a flat surface on the substrate 100 and preventing impurities from infiltrating into the substrate 100 may be further formed. For example, the buffer layer (not shown) may be a single layer or a plurality of layers including silicon nitride and/or silicon oxide.

The first to third anodes 101, 102, and 103 are hole injection electrodes and may include a material having a high work function. The first to third anodes 101, 102, and 103 may include a transparent conductive oxide. For example, the first to third anodes 101, 102, and 103 may each include at least one selected from the group including indium tin oxide, indium zinc oxide, zinc oxide, indium oxide, indium gallium oxide, and aluminum zinc oxide. Also, each of the first to third anodes 101, 102, and 103 may be a single layer or a plurality of layers including metal, such as silver (Ag), aluminum, magnesium, lithium, calcium, etc., and/or an alloy thereof.

Although not illustrated in FIG. 2, the first to third anodes 101, 102, and 103 may be electrically connected to first to third thin film transistors (not shown) respectively, such that the first to third thin film transistors (not shown) are arranged between the substrate 100 and the first to third anodes 101, 102, and 103.

Figure 3A:
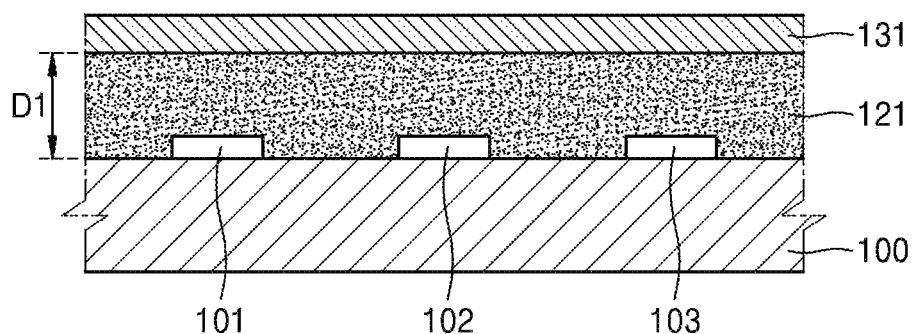
FIG. 3A, FIG. 3B, FIG. 3C, FIG. 3D, FIG. 3E, and FIG. 3F are schematic cross-sectional views of a first unit process of the organic light-emitting display apparatus according to an exemplary embodiment.

Referring to FIG. 3A, a lift-off layer 121 including a fluoropolymer is formed on the substrate 100 on which the first to third anodes 101, 102, and 103 are formed, to have a first thickness D1. Then, first photoresist 131 is formed on the lift-off layer 121.

The fluoropolymer included in the lift-off layer 121 may include a polymer containing about 20 wt % to about 60 wt % of fluorine. For example, the fluoropolymer included in the lift-off layer 121 may include at least one of polytetrafluoroethylene, polychlorotrifluoroethylene, polydichlorodifluoroethylene, a copolymer of chlorotrifluoroethylene and dichlorodifluoroethylene, a copolymer of tetrafluoroethylene and perfluoroalkylvinylether, a copolymer of chlorotrifluoroethylene and perfluoroalkylvinylether, a copolymer of tetrafluoroethylene and perfluoroalkylvinylether, and a copolymer of chlorotrifluoroethylene and perfluoroalkylvinylether.

The lift-off layer 121 may be formed on the substrate 100 by using an application method, a printing method, a deposition method, or the like. When the lift-off layer 121 is formed by an application method or a printing method, a process of forming photoresist may be performed after performing a hardening process and a polymerization process, if necessary.

The first thickness D1 of the lift-off layer 121 may be about 0.2 μm to about 5 μm. If the lift-off layer 121 is excessively thick, a time taken to melt the lift-off layer 121 for patterning increases, and accordingly, a manufacturing process time may increase. If the lift-off layer 121 is excessively thin, it becomes difficult to lift off the lift-off layer 121.

The lift-off layer 121 may further include a moisture absorbent. The moisture absorbent may include various materials. The moisture absorbent is a compound, such as calcium oxide, barium oxide, aluminum oxide, magnesium oxide, etc., in which metal-to-metal connection is made via oxygen, and may include a material that reacts with water to form metal hydroxide. The moisture absorbent may include one selected from the group including a metal halide, an inorganic acid salt of metal, an organic acid salt, a porous inorganic compound, and a combination thereof. The moisture absorbent may include an acryl-based organic material, a methacryl-based organic material, a polyisoprene-based organic material, a vinyl-based organic material, an epoxy-based organic material, a urethane-based organic material, a cellulose-based organic material, or the like. The moisture absorbent may include a titania-based inorganic material, a silicon oxide-based inorganic material, a zirconia-based inorganic material, an alumina-based inorganic material, or the like. The moisture absorbent may include a sealant made of epoxy silane, vinyl silane, aminosilane, or methacrylate silane. The moisture absorbent may capture moisture generated during the first unit process and prevent degradation of the first organic functional layer 141 formed during the first unit process.

The first photoresist 131 is formed on the lift-off layer 121. The first photoresist 131 may be exposed and developed by using a first photomask (not shown). The first photoresist 131 may be a positive-type photoresist or a negative-type photoresist. In the present exemplary embodiment, the positive-type photoresist will be described as an example.

Figure 3B:
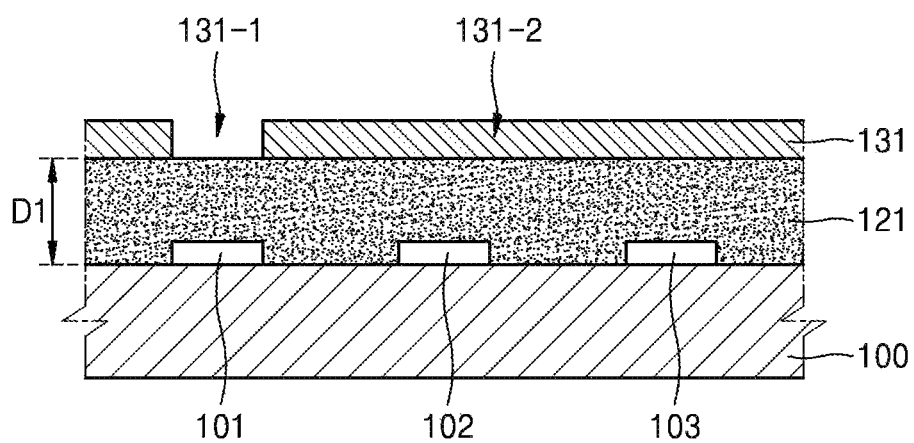

Referring to FIG. 3B, the first photoresist 131 has a patterned shape. A first portion 131-1 of the first photoresist 131, which is a location corresponding to the first anode 101, is removed by exposure and development, and a second portion 131-2 of the first photoresist 131, which is a region outside the first portion 131-1, remains.

Figure 3C:
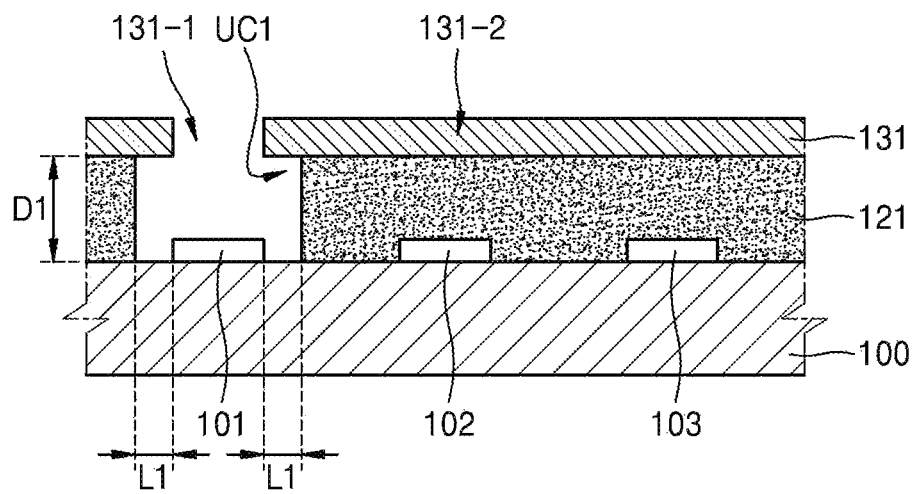

Referring to FIG. 3C, the lift-off layer 121 is etched by using a pattern of the first photoresist 131 of FIG. 3B as an etching mask.

Because the lift-off layer 121 includes a fluoropolymer, a solvent capable of etching the fluoropolymer is used as an etchant.

A first solvent (not shown) including fluorine may be used as the etchant. The first solvent may include hydrofluoroether. The hydrofluoroether has low reactivity with another material and thus, is electrochemically stable. The hydrofluoroether has a low global warming factor and low toxicity and thus, is environmentally stable.

By the etching process, a portion of the lift-off layer 121, which is formed in a location corresponding to the first portion 131-1, that is, on the first anode 101, is etched. As a first undercut profile UC1 is formed under a boundary surface of the first portion 131-1 of the first photoresist 131, the lift-off layer 121 is etched so as to be spaced apart from a side surface of the first anode 101 by a predetermined first distance L1.

Figure 3D:
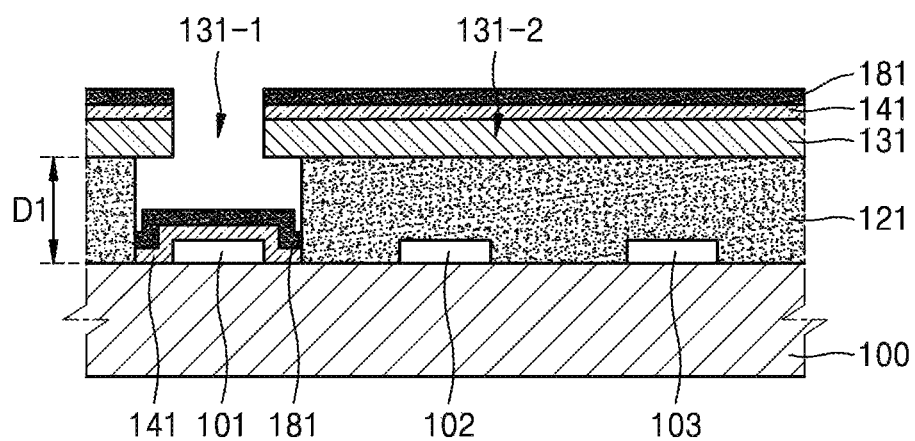

Referring to FIG. 3D, the first organic functional layer 141 and the first auxiliary cathode 181 are sequentially formed on a structure of FIG. 3C.

The first organic functional layer 141 includes a first organic emission layer. The first organic functional layer 141 may further include at least one functional layer from among a hole injection layer, a hole transport layer, an electron transport layer, and an electron injection layer.

The first organic functional layer 141 may be formed by vacuum deposition. In the deposition process, the lift-off layer 121 and the first photoresist 131 serve as a deposition mask. One portion of the first organic functional layer 141 is formed in a location corresponding to the first portion 131-1, that is, on the first anode 101, and the other portion of the first organic functional layer 141 is formed on the second portion 131-2 of the first photoresist 131.

Similarly, the first auxiliary cathode 181 may be formed by vacuum deposition. In the deposition process, the lift-off layer 121 and the first photoresist 131 serve as a deposition mask. One portion of the first auxiliary cathode 181 is formed so as to cover an upper surface of the first organic functional layer 141. In addition, over the second portion 131-2, which is the rest of the first photoresist 131 minus the first portion 131-1, the other portion of the first auxiliary cathode 181 is formed on the first organic functional layer 141.

The first auxiliary cathode 181 may include the same material as that of the cathode 180 as a common electrode which will be described later. In addition, the first auxiliary cathode 181 may include a material different from that of the cathode 180. The first auxiliary cathode 181 may serve as a barrier protecting the first organic functional layer 141 from a solvent used in a lift-off process which will be described later.

Figure 3E:
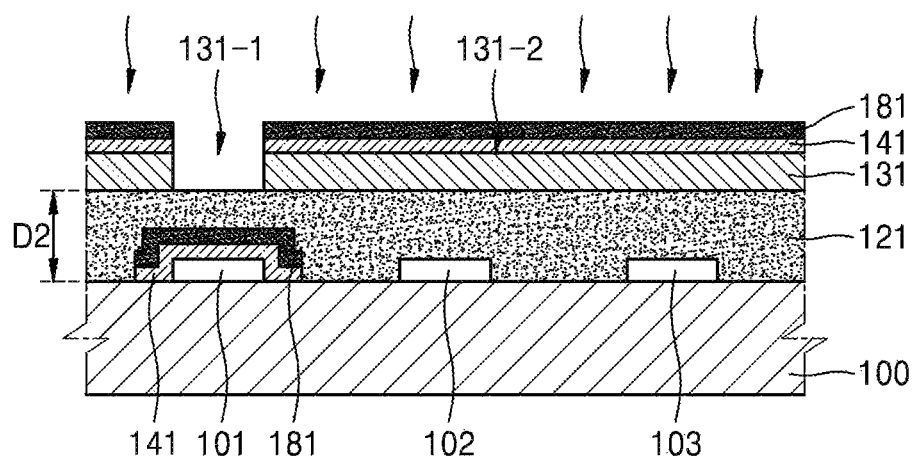

Referring to FIG. 3E, a predetermined heat treatment process is performed on a structure of FIG. 3D.

The lift-off layer 121 including a fluoropolymer has a small surface energy and accordingly, has low reactivity with a different type of material. Due to these properties, when the lift-off layer 121 is heat-treated at a low temperature, the lift-off layer 121 reflows and thus, fills a region of the lift-off layer 121 corresponding to the removed first portion 131-1 and becomes even. Here, the entire thickness of the lift-off layer 121 decreases from the first is thickness D1 to a second thickness D2.

The heat treatment process may be performed at a temperature equal to or greater than 60° C. and less than or equal to 90° C. If the temperature is below 60° C., it is hard for the reflow phenomenon to occur, and if the temperature is above 90° C., a first organic function layer may degrade.

Figure 3F:
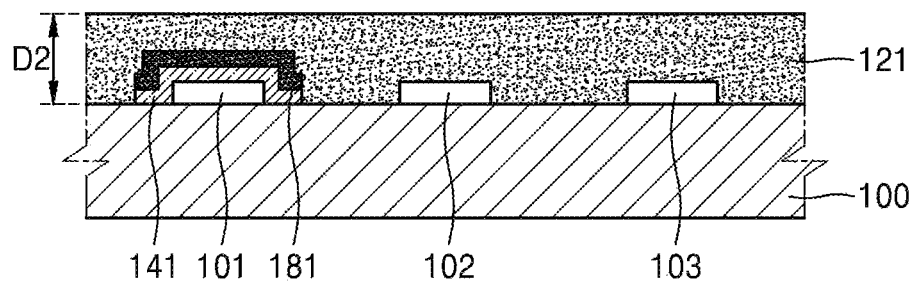

Referring to FIG. 3F, the second portion 131-2 (refer to FIG. 3E) of the first photoresist 131 remaining in a structure of FIG. 3E is removed. The first organic functional layer 141 and the first auxiliary cathode 181 that remain on the first photoresist 131 are removed as well as the first photoresist 131. As a result, the first organic functional layer 141 and the first auxiliary cathode 181 remain on the first anode 101 as a pattern, and the substrate 100 is evenly covered by the lift-off layer 121.

After the first unit process is performed, the second unit process for forming, in a region where the second anode 102 is located, the second organic functional layer 142 (refer to FIG. 4D) emitting a color different from that of the first organic functional layer 141 is performed. Hereinafter, the second unit process will be described with reference to FIGS. 4A to 4F.

Figure 4A:
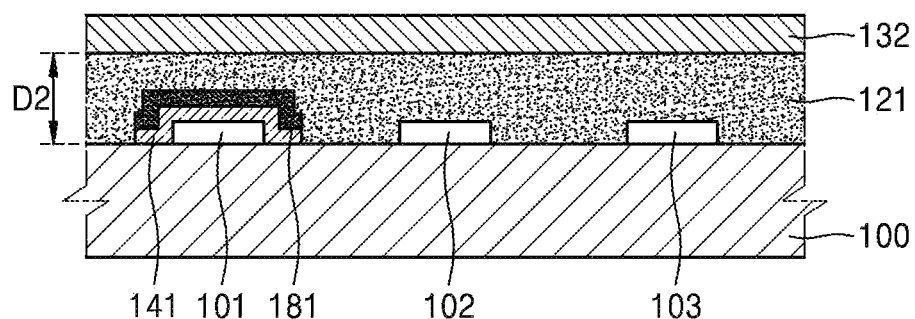
FIG. 4A, FIG. 4B, FIG. 4C, FIG. 4D, FIG. 4E, and FIG. 4F are schematic cross-sectional views of a second unit process of the organic light-emitting display apparatus according to an exemplary embodiment.

Referring to FIG. 4A, second photoresist 132 is formed on the lift-off layer 121 having the second thickness D2.

The second photoresist 132 may be exposed and developed by using a second photomask (not shown). The second photoresist 132 may be a positive-type photoresist or a negative-type photoresist. In the present exemplary embodiment, the positive-type photoresist will be described as an example.

Figure 4B:
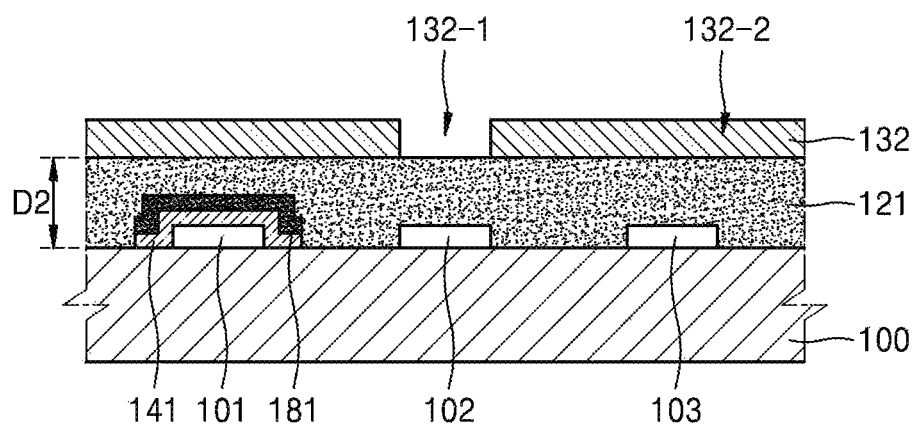

Referring to FIG. 4B, the second photoresist 132 has a patterned shape. A first portion 132-1 of the second photoresist 132, which is a location corresponding to the second anode 102, is removed by exposure and development, and a second portion 132-2 of the second photoresist 132, which is a region outside the first portion 132-1, remains.

Figure 4C:
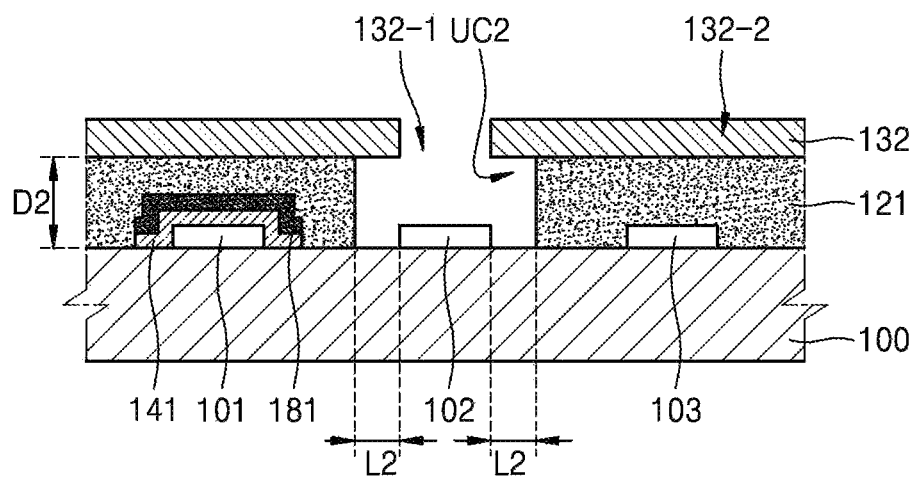

Referring to FIG. 4C, the lift-off layer 121 is etched by using a pattern of the second photoresist 132 of FIG. 4B as an etching mask.

Because the lift-off layer 121 includes a fluoropolymer, a solvent capable of etching the fluoropolymer is used as an etchant.

A first solvent (not shown) including fluorine may be used as the etchant. As in the first unit process, the first solvent may include hydrofluoroether. In some exemplary embodiments, a material different from that used in the first unit process may be used as the first solvent.

By the etching process, a portion of the lift-off layer 121, which is formed in a location corresponding to the first portion 132-1, that is, on the second anode 102, is etched. As a second undercut profile UC2 is formed under a boundary surface of the first portion 132-1 of the second photoresist 132, the lift-off layer 121 is etched so as to be spaced apart from a side surface of the second anode 102 by a predetermined second distance L2. When the etching process is performed during the same time period as the first unit process by using the same solvent as that used in the first unit process, the second undercut profile UC2 extends further, and thus, the second distance L2 is greater than the first distance L1 of the first unit process.

Figure 4D:
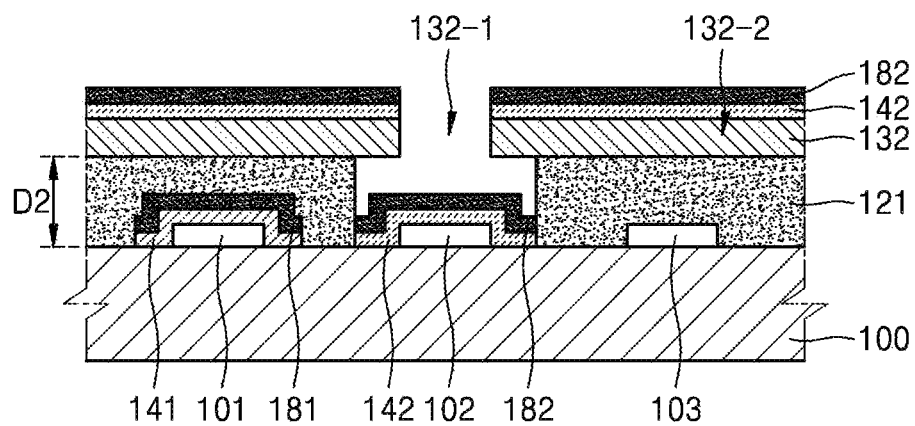

Referring to FIG. 4D, the second organic functional layer 142 and the second auxiliary cathode 182 are sequentially formed on a structure of FIG. 4C.

The second organic functional layer 142 includes a second organic emission layer. The second organic functional layer 142 may further include at least one functional layer from among a hole injection layer, a hole transport layer, an electron transport layer, and an electron injection layer.

The second organic functional layer 142 may be formed by vacuum deposition. In the deposition process, the lift-off layer 121 and the second photoresist 132 serve as a deposition mask. One portion of the second organic functional layer 142 is formed in a location corresponding to the first portion 132-1, that is, on the second anode 102, and the other portion of the second organic functional layer 142 is formed on the second portion 132-2 of the second photoresist 132.

Similarly, the second auxiliary cathode 182 may be formed by vacuum deposition. In the deposition process, the lift-off layer 121 and the second photoresist 132 serve as a deposition mask. One portion of the second auxiliary cathode 182 is formed so as to cover an upper surface of the second organic functional layer 142. In addition, over the second portion 132-2, which is the rest of the second photoresist 132 minus the first portion 132-1, the other portion of the second auxiliary cathode 182 is formed on the second organic functional layer 142.

The second auxiliary cathode 182 may include a material that is the same as, or different from, that of the first auxiliary cathode 181. The second auxiliary cathode 182 may include the same material as that of the cathode 180 as a common electrode, which will be described later. In addition, the second auxiliary cathode 182 may include a material different from that of the cathode 180. The second auxiliary cathode 182 may serve as a barrier protecting the second organic functional layer 142 from a solvent used in a lift-off process which will be described later.

Figure 4E:
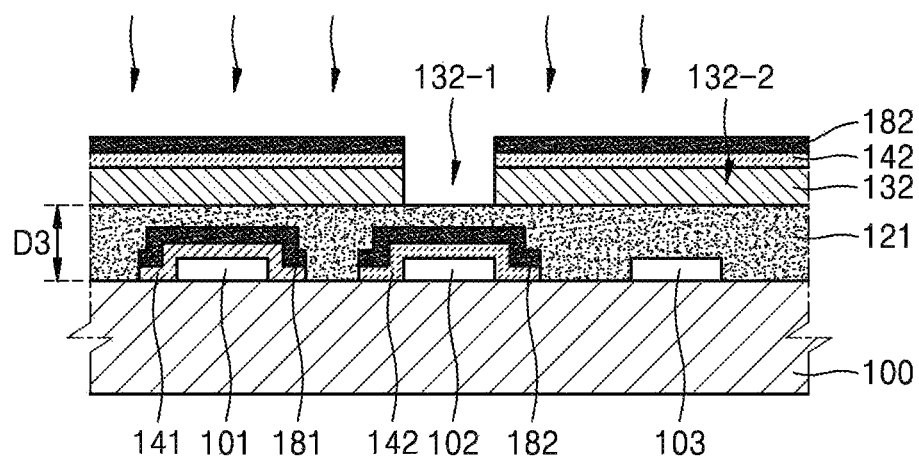

Referring to FIG. 4E, a predetermined heat treatment process is performed on a structure of FIG. 4D.

The heat treatment process may be performed at a temperature equal to or greater than 60° C. and less than or equal to 90° C. The heat treatment process may be performed at a temperature that is the same as, or different from, that in the first unit process. A heat treatment time period may be the same as or different from that of the first unit process. Due to the heat treatment process, the lift-off layer 121 reflows and thus, fills a region of the lift-off layer 121 corresponding to the removed first portion 132-1, and becomes even. Here, the entire thickness of the lift-off layer 121 decreases from the second thickness D2 to a third thickness D3.

Figure 4F:
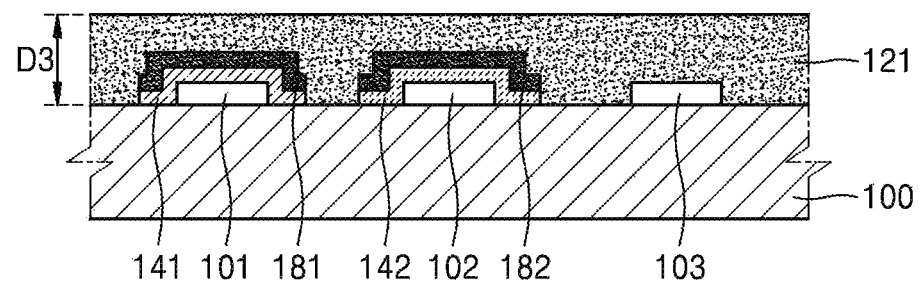

Referring to FIG. 4F, the second portion 132-2 (refer to FIG. 4E) of the second photoresist 132 remaining in a structure of FIG. 4E is removed. The second organic functional layer 142 and the second auxiliary cathode 182 that remain on the second photoresist 132 are removed, as well as the second photoresist 132. As a result, the first organic functional layer 141 and the first auxiliary cathode 181 on the first anode 101 and the second organic functional layer 142 and the second auxiliary cathode 182 on the second anode 102 remain as patterns, and the substrate 100 is evenly covered by the lift-off layer 121.

After the second unit process is performed, the third unit process for forming, in a region where the third anode 103 is located, the third organic functional layer 143 (refer to FIG. 5D) emitting color different from those of the first organic functional layer 141 and the second organic functional layer 142 is performed. Hereinafter, the third unit process will be described with reference to FIGS. 5A to 5E.

Figure 5A:
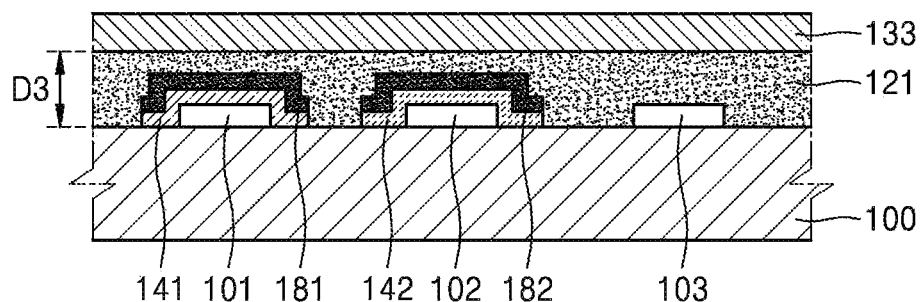
FIG. 5A, FIG. 5B, FIG. 5C, FIG. 5D, and FIG. 5E are schematic cross-sectional views of a third unit process of the organic light-emitting display apparatus according to an exemplary embodiment.

Referring to FIG. 5A, third photoresist 133 is formed on the lift-off layer 121 having the third thickness D3.

The third photoresist 133 may be exposed and developed by using a third photomask (not shown). The third photoresist 133 may be a positive-type photoresist or a negative-type photoresist. In the present exemplary embodiment, the positive-type photoresist will be described as an example.

Figure 5B:
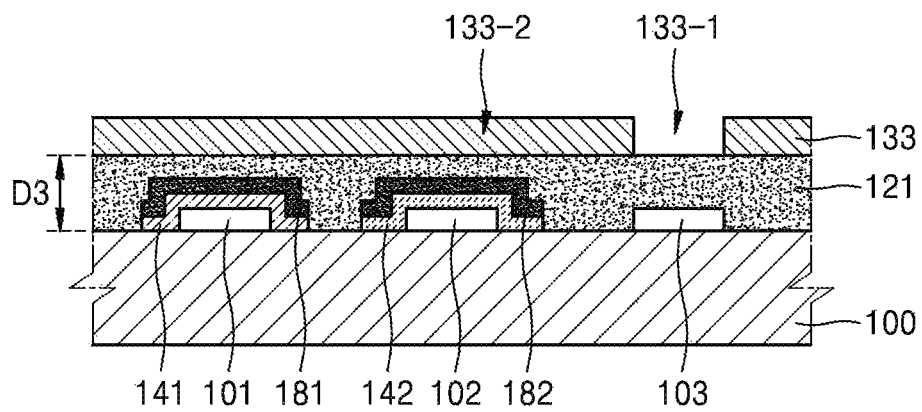

Referring to FIG. 5B, the third photoresist 133 has a patterned shape. A first portion 133-1 of the third photoresist 133, which is a location corresponding to the third anode 103, is removed by exposure and development, and a second portion 133-2 of the third photoresist 133, which is a region outside the first portion 133-1, remains.

Figure 5C:
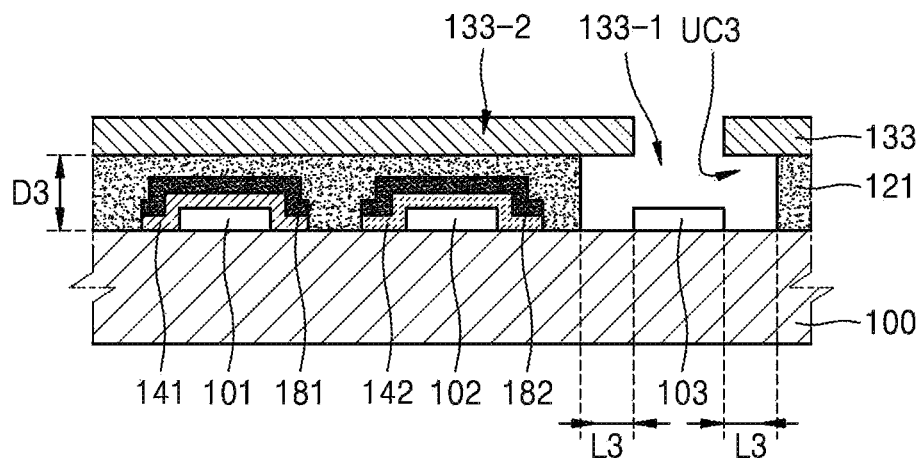

Referring to FIG. 5C, the lift-off layer 121 is etched by using a pattern of the third photoresist 133 of FIG. 5B as an etching mask.

Because the lift-off layer 121 includes a fluoropolymer, a solvent capable of etching the fluoropolymer is used as an etchant.

A first solvent (not shown) including fluorine may be used as the etchant. As in the first and second unit processes, the first solvent may include hydrofluoroether. In some exemplary embodiments, a material different from that used in the first and second unit processes may be used as the first solvent.

By the etching process, a portion of the lift-off layer 121, which is formed in a location corresponding to the first portion 133-1, that is, on the third anode 103, is etched. As a third undercut profile UC3 is formed under a boundary surface of the first portion 133-1 of the third photoresist 133, the lift-off layer 121 is etched so as to be spaced apart from a side surface of the third anode 103 by a predetermined third distance L3. When the etching process is performed during the same time period as the second unit process by using the same solvent as that used in the second unit process, the third undercut profile UC3 extends further, and thus, the third distance L3 is greater than the second distance L2 of the second unit process.

Figure 5D:
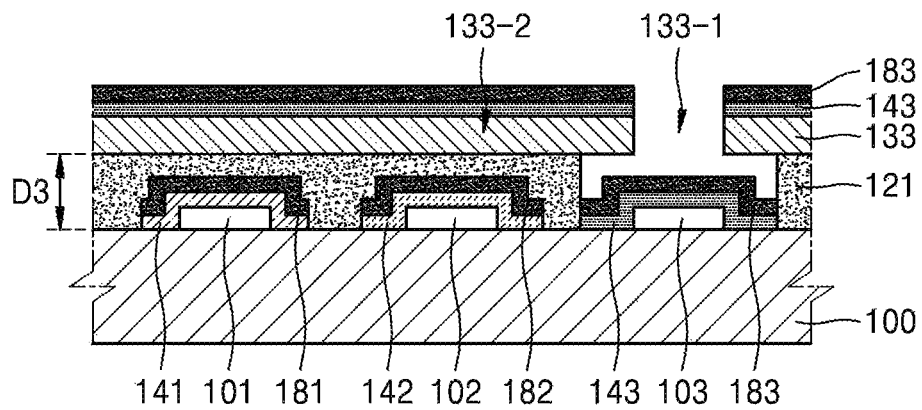

Referring to FIG. 5D, the third organic functional layer 143 and the third auxiliary cathode 183 are sequentially formed on a structure of FIG. 5C.

The third organic functional layer 143 includes a third organic emission layer. The third organic functional layer 143 may further include at least one functional layer from among a hole injection layer, a hole transport layer, an electron transport layer, and an electron injection layer.

The third organic functional layer 143 may be formed by vacuum deposition. In the deposition process, the lift-off layer 121 and the third photoresist 133 serve as a deposition mask. One portion of the third organic functional layer 143 is formed in a location corresponding to the first portion 133-1, that is, on the third anode 103, and the other portion of the third organic functional layer 143 is formed on the second portion 133-2 of the third photoresist 133.

Similarly, the third auxiliary cathode 183 may be formed by vacuum deposition. In the deposition process, the lift-off layer 121 and the third photoresist 133 serve as a deposition mask. One portion of the third auxiliary cathode 183 is formed so as to cover an upper surface of the third organic functional layer 143 which is in a location corresponding to the first portion 133-1. In addition, over the second portion 133-2, which is the rest of the third photoresist 133 minus the first portion 133-1, the other portion of the third auxiliary cathode 183 is formed on the third organic functional layer 143.

The third auxiliary cathode 183 may include a material that is the same as, or different from, that of the first auxiliary cathode 181 and the second auxiliary cathode 182. The third auxiliary cathode 183 may include the same material as that of the cathode 180 as a common electrode, which will be described later. In addition, the third auxiliary cathode 183 may include a material different from that of the cathode 180. The third auxiliary cathode 183 may serve as a barrier protecting the third organic functional layer 143 from a solvent used in a lift-off process, which will be described later.

Figure 5E:
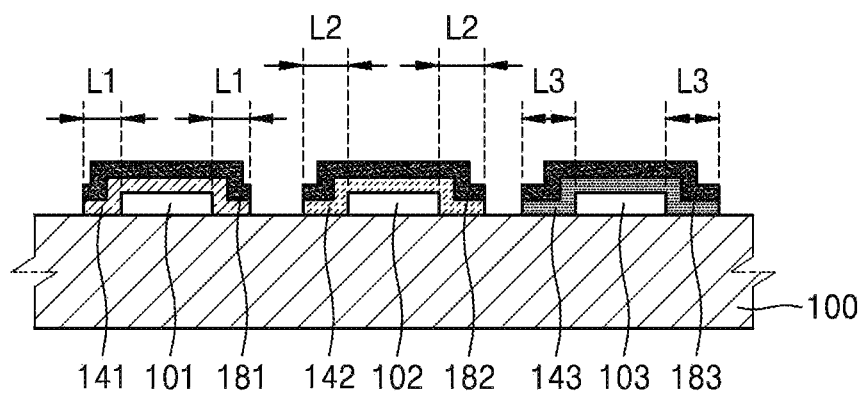

Referring to FIG. 5E, the lift-off process is performed on a structure of FIG. 5D.

Because the lift-off layer 121 includes a fluoropolymer, a second solvent including fluorine is used in the lift-off process. The lift-off process is performed after the third organic functional layer 143 is formed, and accordingly, a material having low reactivity with the third organic functional layer 143 may be used as the second solvent. Similar to the first solvent, the second solvent may also include hydrofluoroether.

By lift-offing the lift-off layer 121 formed under the second portion 133-2 of the third photoresist 133, as a result, the first organic functional layer 141 and the first auxiliary cathode 181 on the first anode 101, the second organic functional layer 142 and the second auxiliary cathode 182 on the second anode 102, and the third organic functional layer 143 and the third auxiliary cathode 183 on the third anode 103 remain as patterns. Here, since the second distance L2 is greater than the first distance L1, and the third distance L3 is greater than the second distance L2, an area of the second organic functional layer 142 is greater than that of the first organic functional layer 141, and an area of the third organic functional layer 143 is greater than that of the second organic functional layer 142.

The first to third organic functional layers 141, 142, and 143 may emit light having different colors from one another. The colors of the light emitted from the first to third organic functional layers 141, 142, and 143 may be mixed to form white light. For example, the first to third organic functional layers 141, 142, and 143 may emit red light, green light, and blue light. For example, the first to third organic functional layers 141, 142, and 143 may be configurations of sub-pixels constituting a unit pixel of the organic light-emitting display apparatus 1.

The organic light-emitting display apparatus 1 of FIG. 1 may show one unit pixel. Also, the present exemplary embodiment may be applied to an organic light-emitting display apparatus including the unit pixel of FIG. 1 in a plurality of numbers. That is, a plurality of first organic functional layers 141 emitting first light may be simultaneously formed as a first group by the first unit process, a plurality of second organic functional layers 142 emitting second light may be simultaneously formed as a second group by the second unit process, and a plurality of third organic functional layers 143 emitting third light may be simultaneously formed as a third group by the third unit process. Through the first to third unit processes, full color may be implemented.

Referring to FIG. 1 again, the cathode 180 is formed on a structure of FIG. 5E. The cathode 180 may be integrally formed as a common electrode on the first to third auxiliary cathodes 181, 182, and 183.

In the present exemplary embodiment, the first to third anodes 101, 102, and 103 are hole injection electrodes, and the first to third auxiliary cathodes 181, 182, and 183 and the cathode 180 are electron injection electrodes. However, this is merely an example, and an electron injection electrode may be formed in a region where the first to third anodes 101, 102, and 103 are located, and a hole injection electrode may be formed in a region where the first to third auxiliary cathodes 181, 182, and 183 and the cathode 180 are located.

In a process of depositing an organic functional layer by using a metal mask including an opening, the metal mask makes precise processing difficult due to its thickness and alignment tolerance and thus is difficult to use in a ultra high-resolution panel, and it is difficult to make the metal mask large because of sagging due to the weight of metal. On the other hand, according to the present exemplary embodiment, a process of forming first to third organic functional layers 141, 142, and 143 patterns is performed through the reflow process and the lift-off process instead of deposition using the metal mask, and accordingly, problems caused by using the metal mask may be solved.

In the present exemplary embodiment, by allowing, via a heat treatment process, the remaining lift-off layer 121 to reflow in FIG. 3E of the first unit process and FIG. 4E of the second unit process instead of removing the remaining lift-off layer 121 by using lift-off processes, and performing only the one lift-off process in FIG. 5E of the third unit process, the cost of coating the high-priced fluoropolymer resin used in the lift-off layer 121 may be decreased, and thus, cost may be reduced. Hereinafter, the present exemplary embodiment will be described in comparison with a method of manufacturing an organic light-emitting display apparatus according to a comparative example of FIGS. 6A to 8E.

FIGS. 6A to 6E are schematic cross-sectional views of a first unit process of an organic light-emitting display apparatus according to a comparative example. FIGS. 7A to 7E are schematic cross-sectional views of a second unit process of the organic light-emitting display apparatus according to a comparative example. FIGS. 8A to 8E are schematic cross-sectional views of a third unit process of the organic light-emitting display apparatus according to a comparative example.

Figure 6A:
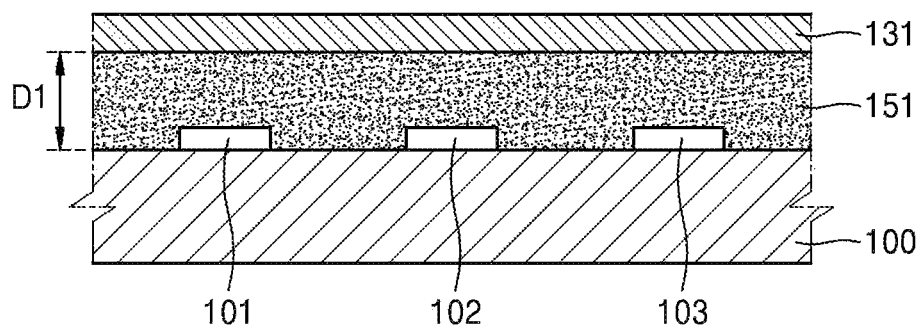
FIG. 6A, FIG. 6B, FIG. 6C, FIG. 6D, and FIG. 6E are schematic cross-sectional views of a first unit process of an organic light-emitting display apparatus according to a comparative example.

Referring to FIG. 6A, a first lift-off layer 151 including a fluoropolymer is formed on the substrate 100 on which the first to third anodes 101, 102, and 103 are formed, to have the first thickness D1. Then, the first photoresist 131 is formed on the first lift-off layer 151. In the present comparative example, the first lift-off layer 151 is formed of the same material and the same thickness as those of the lift-off layer 121 of the previous first exemplary embodiment.

Figure 6B:
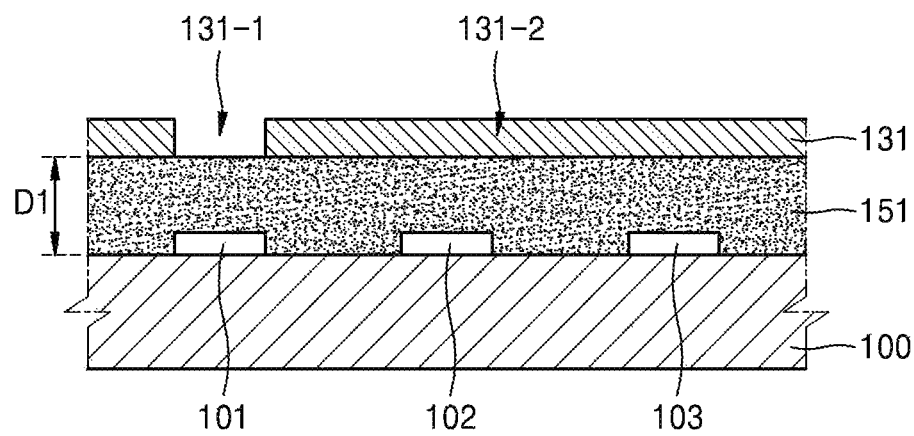

Referring to FIG. 6B, the first photoresist 131 has a patterned shape. The first portion 131-1 of the first photoresist 131, which is a location corresponding to the first anode 101, is removed by exposure and development, and the second portion 131-2 of the first photoresist 131, which is a region outside the first portion 131-1, remains.

Figure 6C:
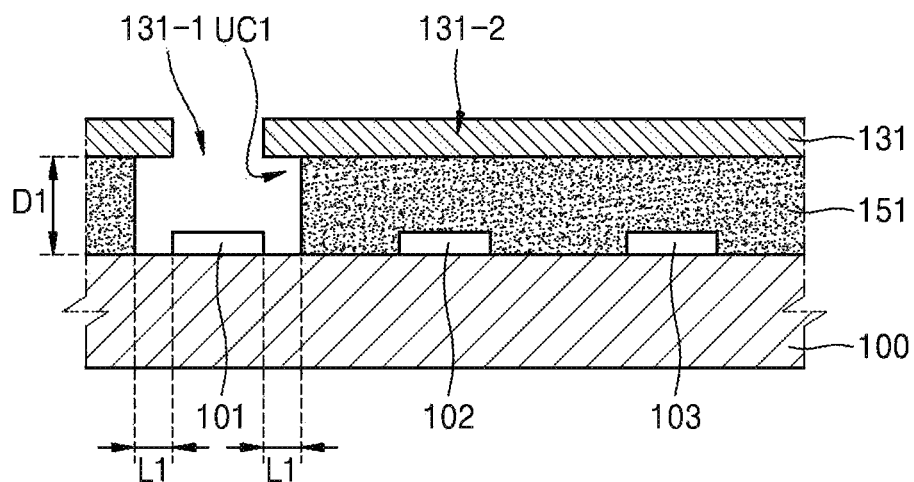

Referring to FIG. 6C, with a pattern of the first photoresist 131 of FIG. 6B as an etching mask, the first lift-off layer 151 is etched by using a first solvent (not shown) including fluorine. By the same etching process as the first unit process of the first exemplary embodiment, a portion of the first lift-off layer 151, which is formed in a location corresponding to the first portion 131-1, that is, on the first anode 101, is etched. As the first undercut profile UC1 is formed under a boundary surface of the first portion 131-1 of the first photoresist 131, the first lift-off layer 151 is etched so as to be spaced apart from a side surface of the first anode 101 by the predetermined first distance L1.

Figure 6D:
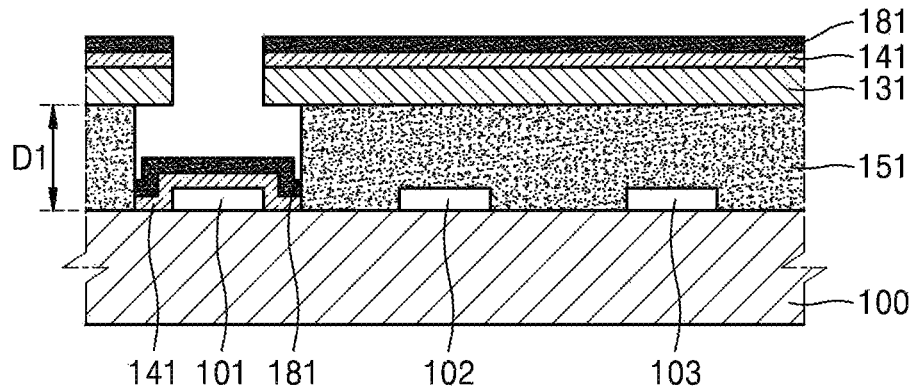

Referring to FIG. 6D, the first organic functional layer 141 and the first auxiliary cathode 181 are sequentially formed on a structure of FIG. 6C.

Figure 6E:
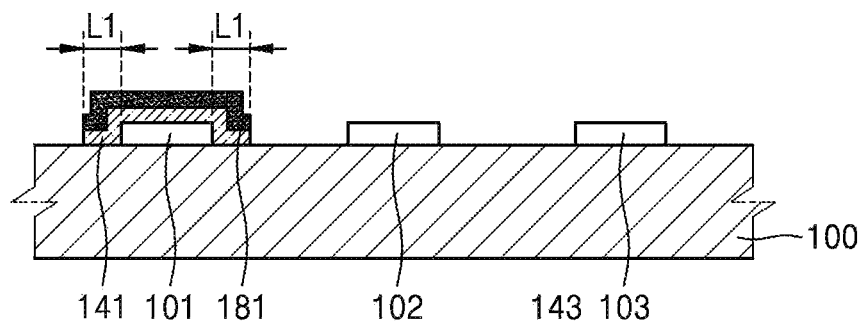

Referring to FIG. 6E, a first lift-off process is performed to entirely remove the remaining first lift-off layer 151, and as a result, the first organic functional layer 141 and the first auxiliary cathode 181 on the first anode 101 remain as a pattern.

In the first unit process of the previous first exemplary embodiment, the lift-off layer 121 is not removed by the lift-off process but is allowed, via a heat treatment process, to reflow, and thus, the lift-off layer 121 is reused in the second unit process, whereas in the comparative example, the first lift-off layer 151 is entirely removed.

Figure 7A:
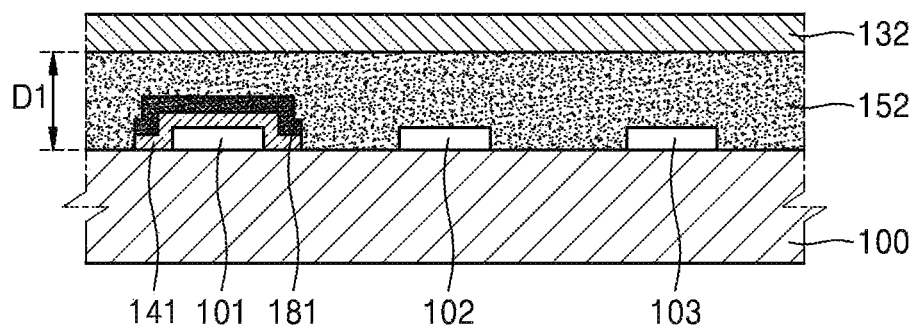
FIG. 7A, FIG. 7B, FIG. 7C, FIG. 7D, and FIG. 7E are schematic cross-sectional views of a second unit process of the organic light-emitting display apparatus according to a comparative example.

Referring to FIG. 7A, a second lift-off layer 152 with a first thickness D1, including a fluoropolymer, is again formed on the substrate 100, and then, the second photoresist 132 is formed on the second lift-off layer 152.

Figure 7B:
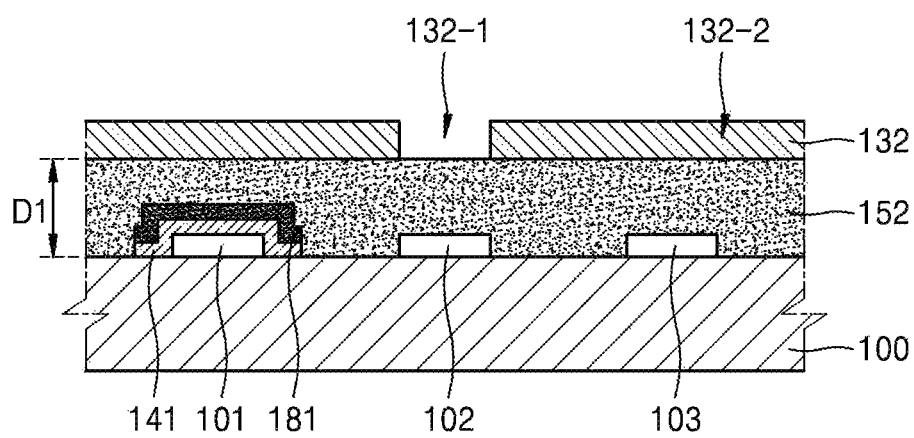

Referring to FIG. 7B, the second photoresist 132 is patterned by exposure and development so that the first portion 132-1 of the second photoresist 132, which is a location corresponding to the second anode 102, may be removed, and the second portion 132-2 of the second photoresist 132, which is a region outside the first portion 132-1, may remain.

Figure 7C:
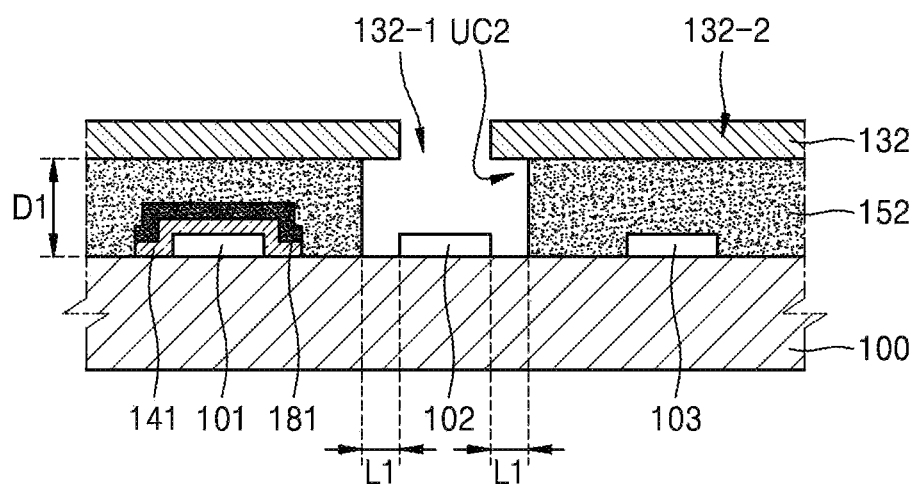

Referring to FIG. 7C, utilizing a pattern of the second photoresist 132 of FIG. 7B as an etching mask, the second lift-off layer 152 is etched by using the first solvent (not shown) including fluorine. By the same etching process as the first unit process of the first exemplary embodiment, a portion of the second lift-off layer 152, which is formed in a location corresponding to the first portion 132-1, that is, on the second anode 102, is etched. As the second undercut profile UC2 is formed under a boundary surface of the first portion 132-1 of the second photoresist 132, the second lift-off layer 152 is etched so as to be spaced apart from a side surface of the second anode 102 by the predetermined first distance L1.

Figure 7D:
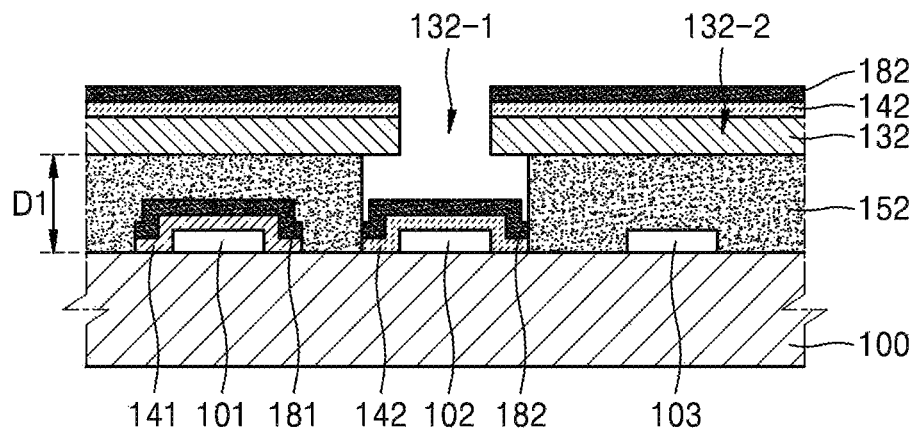

Referring to FIG. 7D, the second organic functional layer 142 and the second auxiliary cathode 182 are sequentially formed on a structure of FIG. 7C.

Figure 7E:
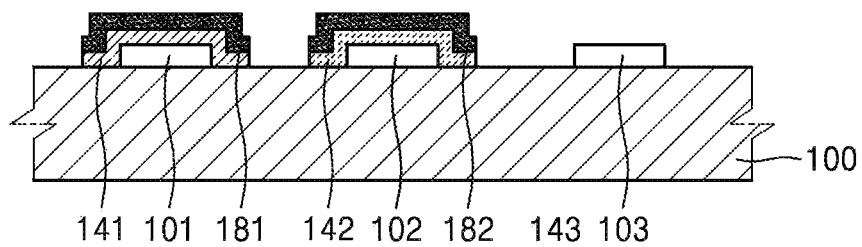

Referring to FIG. 7E, a second lift-off process is performed to entirely remove the remaining second lift-off layer 152, and as a result, the first organic functional layer 141 and the first auxiliary cathode 181 on the first anode 101 and the second organic functional layer 142 and the second auxiliary cathode 182 on the second anode 102 remain as patterns.

In the first unit process and the second unit process of the previous first exemplary embodiment, the lift-off layer 121 is not removed by the lift-off process but is allowed, via a heat treatment process, to reflow, and thus, the lift-off layer 121 is reused in the second unit process and the third unit process, whereas in the comparative example, the first lift-off layer 151 and the second lift-off layer 152 are entirely removed.

Figure 8A:
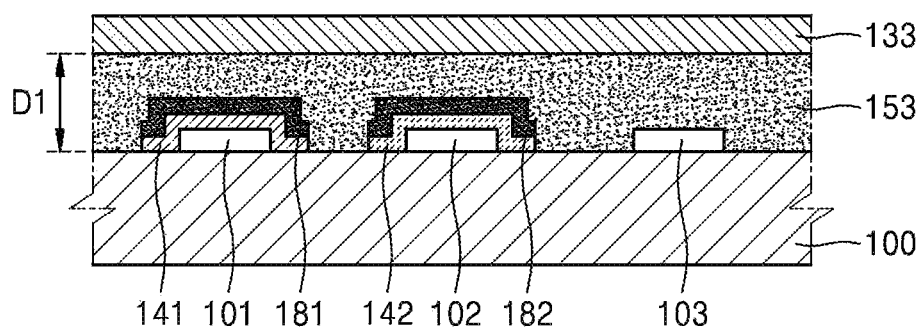
FIG. 8A, FIG. 8B, FIG. 8C, FIG. 8D, and FIG. 8E are schematic cross-sectional views of a third unit process of the organic light-emitting display apparatus according to a comparative example.

Referring to FIG. 8A, a third lift-off layer 153 with the first thickness D1, including a fluoropolymer, is formed on the substrate 100 again, and then, the third photoresist 133 is formed on the third lift-off layer 153.

Figure 8B:
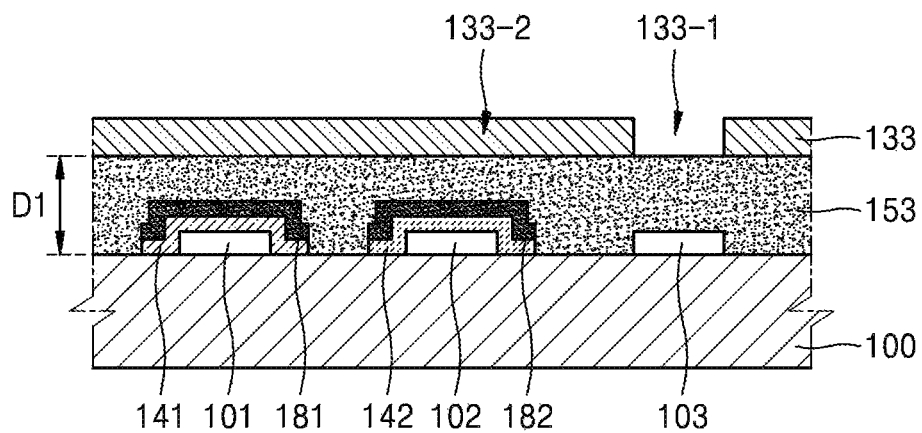

Referring to FIG. 8B, the third photoresist 133 is patterned by exposure and development so that the first portion 133-1 of the third photoresist 133, which is a location corresponding to the third anode 103, may be removed, and the second portion 133-2 of the third photoresist 133, which is a region outside the first portion 133-1, may remain.

Figure 8C:
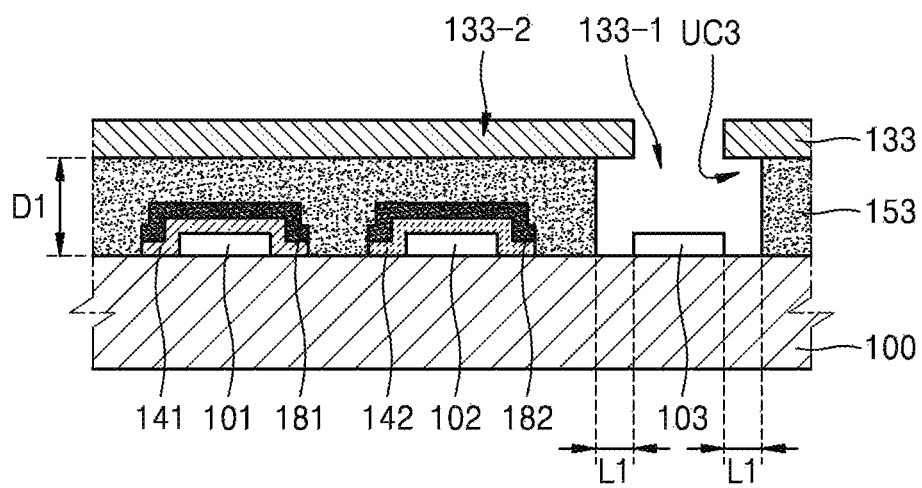

Referring to FIG. 8C, with a pattern of the third photoresist 133 of FIG. 8B as an etching mask, the third lift-off layer 153 is etched by using the first solvent (not shown) including fluorine. By the same etching process as the first unit process of the first exemplary embodiment, a portion of the third lift-off layer 153, which is formed in a location corresponding to the first portion 133-1, that is, on the third anode 103, is etched. As the third undercut profile UC3 is formed under a boundary surface of the first portion 133-1 of the third photoresist 133, the third lift-off layer 153 is etched so as to be spaced apart from a side surface of the third anode 103 by the predetermined first distance L1.

Figure 8D:
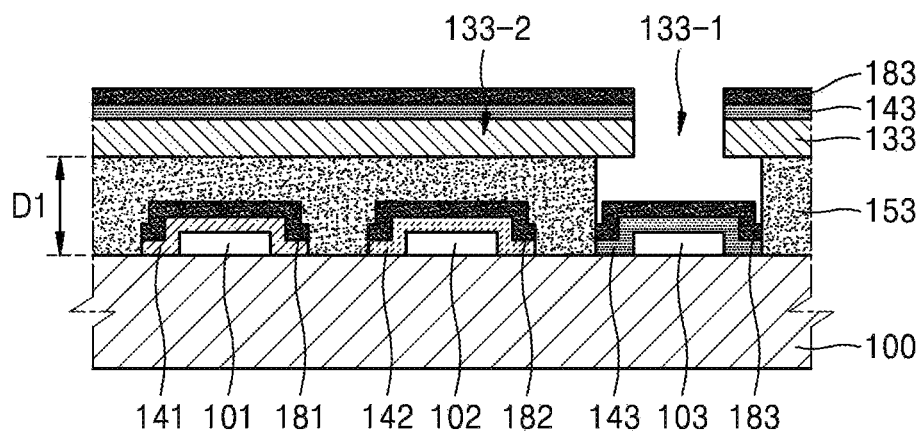

Referring to FIG. 8D, the third organic functional layer 143 and the third auxiliary cathode 183 are sequentially formed on a structure of FIG. 8C.

Figure 8E:
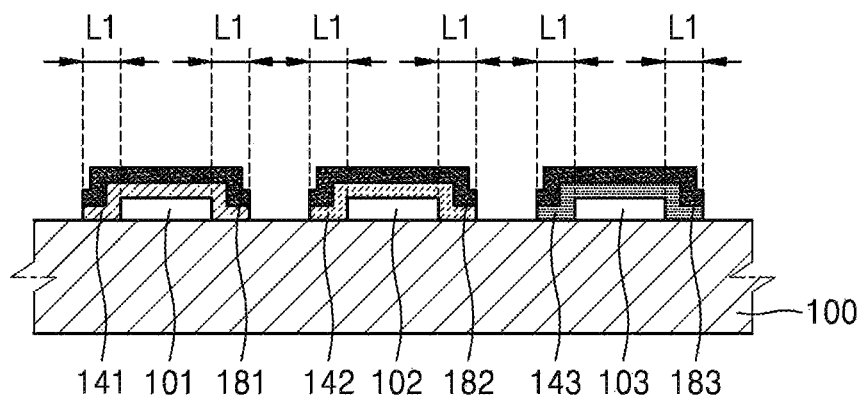

Referring to FIG. 8E, a third lift-off process is performed to entirely remove the remaining third lift-off layer 153, and as a result, the first organic functional layer 141 and the first auxiliary cathode 181 on the first anode 101, the second organic functional layer 142 and the second auxiliary cathode 182 on the second anode 102, and the third organic functional layer 143 and the third auxiliary cathode 183 on the third anode 103 remain as patterns. Here, since the first distance L1 formed during the first to third unit processes is identical, areas of the first to third organic functional layers 141, 142, and 143 are the same as one another.

In the previous first exemplary embodiment, two heat treatment processes and one lift-off process are performed, whereas in the comparative example, three lift-off processes are performed. That is, according to the comparative example, a lift-off process is performed during every unit process, and thus, a lift-off layer including fluorine-based resin which is a high-priced material is used a lot. However, in the present exemplary embodiment, the lift-off process is performed only during the final unit process, and thus, material loss of the lift-off layer is small. Accordingly, cost may be reduced.

Figure 9:
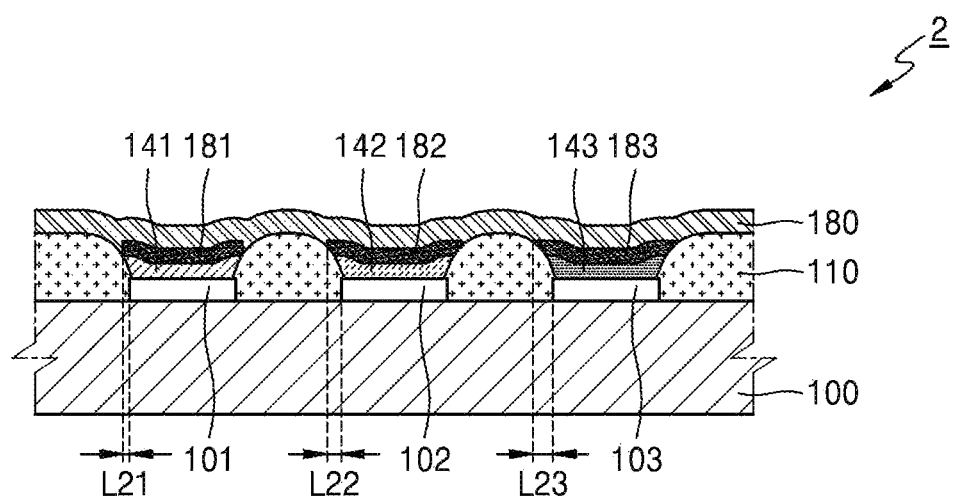
FIG. 9 is a schematic cross-sectional view of an organic light-emitting display apparatus according to another exemplary embodiment.

FIG. 9 is a schematic cross-sectional view of an organic light-emitting display apparatus 2 according to another exemplary embodiment.

The organic light-emitting display apparatus 2 of FIG. 9 further includes a pixel-defining layer 110, compared to the above-described organic light-emitting display apparatus 1.

Referring to FIG. 9, on the substrate 100, a plurality of anodes including the first to third anodes 101, 102, and 103 are formed, and the pixel-defining layer 110 surrounding edges of the first to third anodes 101, 102, and 103 are formed. The first to third organic functional layers 141, 142, and 143 including first to third emission layers are respectively arranged on the first to third anodes 101, 102, and 103, the first to third auxiliary cathodes 181, 182, and 183 are respectively arranged on the first to third organic functional layers 141, 142, and 143, and the integral cathode 180 is disposed on the first to third auxiliary cathodes 181, 182, and 183 and the pixel-defining layer 110 as a common electrode.

The first to third anodes 101, 102, and 103 have sharp ends, and accordingly, when current is applied after the cathode 180 is formed, an electric field may be focused to the ends, and thus, a short circuit may occur during driving. However, in the present exemplary embodiment, by covering ends of the first to third anodes 101, 102, and 103 with the pixel-defining layer 110, the phenomenon in which an electric field is focused to the ends may be prevented.

The pixel-defining layer 110 may include an organic insulation layer including, for example, a general-purpose polymer (poly(methyl methacrylate) (PMMA), polystyrene (PS)), a polymer derivative having a phenol group, an acryl-based polymer, an imide-based polymer, an aryl ether-based polymer, an amide-based polymer, a fluorine-based polymer, a p-xylene based polymer, a vinyl alcohol-based polymer, and a blend thereof.

The pixel-defining layer 110 is obtained by forming a plurality of anodes including the first anode 101, the second anode 102, and the third anode 103 on the substrate 100 and forming a pixel-defining layer surrounding edges of the plurality of anodes in the process of FIG. 2 of the previous first exemplary embodiment and then performing the same as in the first unit process of FIGS. 3A to 3F, the second unit process of FIGS. 4A to 4E, and the third unit process of FIGS. 5A to 5E. Accordingly, since a second distance L22 is greater than a first distance L21, and a third distance L23 is greater than the second distance L22, an area of the second organic functional layer 182 is greater than that of the first organic functional layer 181, and an area of the third organic functional layer 183 is greater than that of the second organic functional layer 182.

Although not illustrated in the above drawings, the above-described organic light-emitting display apparatuses may further include an encapsulation member. The encapsulation member may be a glass substrate, metal foil, a thin film encapsulation layer including an inorganic layer and an organic layer mixed with each other, etc.

According to one or more exemplary embodiments, a high-resolution display panel may be formed because an emission layer is formed without using a fine metal mask (FMM).

Also, according to one or more exemplary embodiments, processes may be simplified by decreasing the number of times a lift-off process being performed.

In addition, according to one or more exemplary embodiments, cost may be reduced by decreasing an amount of fluorine-based resin used in a lift-off layer.

It should be understood that exemplary embodiments described herein should be considered in a descriptive sense only and not for purposes of limitation. Descriptions of features or aspects within each exemplary embodiment should typically be considered as available for other similar features or aspects in other exemplary embodiments.

Although certain exemplary embodiments and implementations have been described herein, other exemplary embodiments and modifications will be apparent from this description. Accordingly, the inventive concept is not limited to such exemplary embodiments, but rather to the broader scope of the presented claims and various obvious modifications and equivalent arrangements.

What is claimed is:

1. A method of manufacturing an organic light-emitting display apparatus, the method comprising:
    forming a first electrode of a first group and a first electrode of a second group on a substrate so as to be separate from each other;
    forming a lift-off layer and first photoresist on the first electrode of the first group and the first electrode of the second group;
    forming a first portion where the lift-off layer is removed, in a region corresponding to the first electrode of the first group, and a second portion where the lift-off layer remains;
    forming, in the first portion, a first organic functional layer comprising a first emission layer and a second electrode of the first group;
    heat-treating the lift-off layer so that the lift-off layer fills the first portion;
    removing the first photoresist, the first organic functional layer, and the second electrode of the first group that remain on the lift-off layer of the second portion;
    forming second photoresist on the lift-off layer;
    forming a third portion where the lift-off layer is removed, in a region corresponding to the first electrode of the second group, and a fourth portion where the lift-off layer remains;
    forming, in the third portion, a second organic functional layer comprising a second emission layer and a second electrode of the second group;
    heat-treating the lift-off layer so that the lift-off layer fills the third portion; and
    removing the second photoresist, the second organic functional layer, and the second electrode of the second group that remain on the lift-off layer of the fourth portion.

2. The method of claim 1, wherein the lift-off layer comprises a fluoropolymer.

3. The method of claim 1, wherein the lift-off layer is heat-treated at a temperature equal to or greater than 60° C. and less than or equal to 90° C.

4. The method of claim 1, wherein the first organic functional layer and the second electrode of the first group are formed by a deposition process.

5. The method of claim 1, wherein the second organic functional layer and the second electrode of the second group are formed by a deposition process.

6. The method of claim 1, wherein:
    the lift-off layer under the first photoresist forms a first undercut profile in the first portion; and
    the lift-off layer under the second photoresist forms a second undercut profile in the second portion,
    wherein a distance between an end of the first electrode of the second group and the second undercut profile is greater than a distance between an end of the first electrode of the first group and the first undercut profile.

7. The method of claim 1, wherein an insulation layer is further formed between the first electrode of the first group and the first electrode of the second group.

8. The method of claim 1, further comprising:
    completely removing the remaining lift-off layer simultaneously with removing the second photoresist, the second organic functional layer, and the second electrode of the second group that remain on the lift-off layer of the fourth portion; and
    forming a common electrode to be integrally and commonly disposed on the second electrode of the first group and the second electrode of the second group.

9. The method of claim 8, wherein the lift-off layer is removed by a solvent comprising fluorine.

10. The method of claim 1, further comprising:
    forming a first electrode of a third group on the substrate; and
    after the removing of the second photoresist, the second organic functional layer, and the second electrode of the second group that remain on the lift-off layer of the fourth portion, s forming third photoresist on the lift-off layer;
    forming a fifth portion where the lift-off layer is removed, in a region corresponding to the first electrode of the third group, and a sixth portion where the lift-off layer remains;
    sequentially forming, in the fifth portion, a third organic functional layer comprising a third emission layer and a second electrode of the third group; and
    completely removing the remaining lift-off layer simultaneously with removing the third photoresist, the third organic functional layer, and the second electrode of the third group that remain on the lift-off layer of the sixth portion, and further forming a common electrode located integral commonly on the second electrode of the first group, the second electrode of the second group, and the second electrode of the third group.

* * * * *